(12) United States Patent
Yamaguchi et al.

(10) Patent No.: US 7,276,702 B2
(45) Date of Patent: Oct. 2, 2007

(54) LIGHT RECEIVING DEVICE FOR MODEL, MODEL, AND SIGNAL LIGHT DETECTING METHOD FOR MODEL

(75) Inventors: Takashi Yamaguchi, Tokyo (JP); Ryoji Hayashi, Tokyo (JP)

(73) Assignee: Konami Corporation, Tokyo (JP)

( * ) Notice: Subject to any disclaimer, the term of this patent is extended or adjusted under 35 U.S.C. 154(b) by 0 days.

(21) Appl. No.: 10/513,876

(22) PCT Filed: May 8, 2003

(86) PCT No.: PCT/JP03/05787

§ 371 (c)(1),
(2), (4) Date: May 10, 2005

(87) PCT Pub. No.: WO03/100367

PCT Pub. Date: Dec. 4, 2003

(65) Prior Publication Data

US 2005/0199785 A1     Sep. 15, 2005

(30) Foreign Application Priority Data

May 8, 2002 (JP) .............................. 2002-133323

(51) Int. Cl.
G01J 5/02 (2006.01)
G02B 5/13 (2006.01)
G02B 17/00 (2006.01)
(52) U.S. Cl. ................. 250/353; 359/726; 359/542
(58) Field of Classification Search ................ 359/708, 359/712, 718, 720, 726, 534, 537, 542; 250/216, 250/353; 398/212

See application file for complete search history.

(56) References Cited

FOREIGN PATENT DOCUMENTS

| JM | 2002-365131 A | 12/2002 |
|---|---|---|
| JP | 59-161046 U | 10/1984 |
| JP | 2-106740 A | 8/1990 |
| JP | 5-2036 U | 1/1993 |
| JP | 5-175910 A | 7/1993 |
| JP | 5-175911 A | 7/1993 |
| JP | 5-206488 A | 8/1993 |
| JP | 5-347591 A | 12/1993 |
| JP | 6-13242 U | 2/1994 |
| JP | 6-52284 U | 7/1994 |
| JP | 6-58636 U | 8/1994 |
| JP | 6-289321 A | 10/1994 |

(Continued)

OTHER PUBLICATIONS

Article in "Nikkan Kogyo Shinbun", No. 18777, 14th edition on Jan. 29, 2002, p. 30.

(Continued)

Primary Examiner—Thanh X. Luu
Assistant Examiner—Brian J Livedalen
(74) Attorney, Agent, or Firm—Darby & Darby

(57) ABSTRACT

A light receiving device 7 includes a sensor 10 for outputting a signal correlating to incident light on a detection surface 10a and a light receiving element 8 disposed in confrontation with the detection surface and capable of transmitting light. The light receiving element has a recessed portion 22 on the opposite surface of the surface confronting the detection surface. A wall surface 24 of the recessed portion reflects the light beam L2 from a lateral direction of the detection surface toward the detection surface 10a.

23 Claims, 12 Drawing Sheets

FOREIGN PATENT DOCUMENTS

| | | |
|---|---|---|
| JP | 7-199005 A | 8/1995 |
| JP | 7-283790 A | 10/1995 |
| JP | 7-111319 B2 | 11/1995 |
| JP | 7-303081 A | 11/1995 |
| JP | 8-270285 A | 10/1996 |
| JP | 8-316913 A | 11/1996 |
| JP | 9-215071 A | 8/1997 |
| JP | 11-211561 A | 8/1999 |
| JP | 2002-85863 A | 3/2002 |
| JP | 3086489 U | 6/2002 |

OTHER PUBLICATIONS

"Micro IR Series, Kondo wa Sensha to Sensuikan Konami to Takara", [online], Jan. 29, 2002, The Mainichi Newspapers Co., Ltd., retrieval date Sep. 9, 2003, Internet <URL:http://www.mainichi.co.jp/life/hobby/game/news/news/2002/01/28-2.html>.

"2002 Konami Toy & Hobby", Konami Co., Ltd, Jun. 12, 2002, pp. 3-6.

LIGHT RECEIVING DEVICE FOR MODEL, MODEL, AND SIGNAL LIGHT DETECTING METHOD FOR MODEL

CROSS-REFERENCE TO PRIOR APPLICATIONS

This is a U.S. national phase application under 35 U.S.C. §371 of International Patent Application No. PCT/JP03/05787 filed May 8, 2003, and claims the benefit of Japanese Patent Application No. 2002-133323 filed May 8, 2002 which is incorporated by reference herein. The International Application was published in Japanese on Dec. 4, 2003 as WO 03/100367 A1 under PCT Article 21(2).

TECHNICAL FIELD

The present invention relates to a light receiving device for a model, a model, and a light receiving method for a model.

BACKGROUND ART

In general, there are known toys for shooting a target with a light beam gun. In these toys, whether a target is hit or not is determined by detecting the light beams from the light beam gun by a sensor disposed to the target.

However, since the sensor has directivity, when the light beams enter obliquely the detection surface of the sensor, the light beams are often not detected. That is, when the target is shot outside of the detection angle of the sensor, even if the target is hit with the light beams, the light beams are not detected.

As a technology for solving the above problem, there is a detection device disclosed in, for example, Japanese Patent Application Publication No. 7-111319. The detection device comprises a light receiving device and a sensor (a detection device). The light receiving device has a light receiving surface such that light beams (shooting spot) are diffused on the light receiving surface and the light beams are transmitted through the light receiving surface, and the sensor detects the light beams received by the light receiving device. Further, the light receiving surface is formed in an outwardly convex shape. In the detection device, since the light beams entering the light receiving surface reach the sensor after they are diffused on the light receiving surface and transmitted therethrough in every direction, shooting executed outside of the detection angle of the sensor can be detected.

In the detection device described above, however, since the light beams are diffused and transmitted, an amount of light that reaches the detection surface of the sensor is reduced. Accordingly, there is a possibility that detection sensitivity is deteriorated.

DISCLOSURE OF THE INVENTION

An object of the present invention, which is made in view of the above circumstances, is to provide a light receiving device, a model, and a light receiving method capable of expanding a detection range without reducing detection sensitivity.

The first light receiving device for a model of the present invention is a light receiving device for a model for receiving signal light and outputting an electric signal according to the signal light, the light receiving device comprises: a sensor for receiving the signal light on a detection surface and outputting a signal correlating to the signal light; and an optical element disposed on a front surface of the detection surface for leading the signal light to the detection surface, wherein the optical element has a reflecting surface slanting to the detection surface with respect to a sectional surface orthogonal to the detection surface in order to cause the signal light from a lateral direction of the detection surface to be incident on the detection surface after reflected on the reflecting surface.

Further, the first signal light detection method for a model of the present invention is a signal light detection method for a model, wherein an optical element being disposed on the front surface of a detection surface for leading a signal light to the detection surface, a reflecting surface slanting to the detection surface with respect to a sectional surface orthogonal to the detection surface is formed to the optical element in order to reflect the signal light on the reflecting surface to cause the signal light from the lateral direction of the detection surface to enter the detection surface, and the signal light from the lateral direction of the detection surface is detected by reflecting the signal light from the lateral direction of the detection surface on the reflecting surface to cause the signal light to enter the detection surface.

According to the first light receiving device for a model and the first signal light detection method for a model of the present invention, the signal light from the lateral direction of the detection surface is reflected on the reflecting surface and reaches the detection surface. In contrast, the signal light from a front direction of the detection surface goes through the reflecting surface and reaches the detection surface. Accordingly, it is possible to maintain the intrinsic detection range of the detection surface as well as to detect the signal light from the lateral direction of the detection surface. That is, it is possible to expand the detection range without deteriorating detection sensitivity. Note that the signal light, the optical element, and the reflecting surface can be realized by infrared rays, a light receiving element, a wall surface of a recessed portion in the best mode for carrying out the invention.

In the first light receiving device for a model and the first signal light detection method for a model of the present invention, the optical element may have a columnar portion, one end surface of the columnar portion may confront the detection surface, the reflecting surface may be composed of a boundary surface formed by disposing a recessed portion to an other end surface of the columnar portion, and the light element may reflect the signal light entering from the columnar surface of the columnar portion on the boundary surface, and may cause the signal light to enter the detection surface. In this case, the sensitivity of the light receiving device can be enhanced because the signal light entering the columnar surface can be converged to the center of the columnar portion.

In the first light receiving device for a model and the first signal light detection method for a model of the present invention, the recessed portion may pass through the detection surface. In this case, a portion of the signal light from the front direction the detection surface does not pass through the optical element and directly reaches the detection surface. Accordingly, it is possible to enhance the sensitivity of the signal light from the front direction of the detection surface.

In the first light receiving device for a model and the first signal light detection method for a model of the present invention, a flat surface may be formed to the boundary surface of the recessed portion. In this case, the light reflected on the flat surface is not diffused as light reflected on a curved surface. Accordingly, the amount of light reflected on the flat surface is less reduced than that of the light reflected on the curved surface. In contrast, a predetermined amount of light is necessary for the sensor to detect light. Accordingly, when a flat surface is formed to confront an arbitrary direction, it is possible to expand a detection distance in the direction.

In the first light receiving device for a model and the first signal light detection method for a model of the present invention, a curved surface may be formed to the boundary surface of the recessed portion. A light reflected on the curved surface is diffused or converged according to the position of the center of curvature of the curved surface and the curvature thereof. Accordingly, it is possible to adjust the detection range of the light receiving device by adjusting the position of the center of curvature and the curvature of the curved surface disposed to the wall surface of the recessed portion.

In the light receiving device for a model and the light receiving method for the model of the present invention, a flat surface and a curved surface may be formed to the wall surface of the recessed portion. In this case, it is possible reflect light while converging or diffusing it on the curved surface and to reflect incident light as it is on the flat surface. Accordingly, making use of the above, it is possible to expand or decrease a detection distance at an arbitrary angle according to an embodiment.

In the first light receiving device for a model and the first signal light detection method for a model of the present invention, a lens formed in a shape convex to the optical element side may be disposed between the detection surface and the optical element. In this case, it is possible to converge signal light, which travels obliquely from the optical element to the detection surface, and signal light, which travels from the optical element to the outside of the detection surface, on the lens to cause the signal light to enter the detection surface, thereby the detection range can expand.

The first light receiving device for a model of the present invention may be mounted the model being remote controlled by a signal light from a transmitter and executes a communication with other model by a signal light, and the sensor may detect the signal light from the transmitter and the signal light from the other model. Further, the first signal light detection method of the present invention may be a signal light detection method for the model which is remote controlled by a signal light from a transmitter and executes a communication with another model by a signal light, wherein the signal light from the transmitter and the signal light from the other model may be received by the detection surface. When signal light is received from both a transmitter and a drive unit by one light receiving device, the positions of the transmitter and the drive unit are restricted due to the directivity of the detection surface. In this case, a remote control system having a high degree of freedom with respect to the positions of the transmitter and the drive unit can be realized by applying the light receiving device of the present invention.

The first model of the present invention is a model having a light receiving device and executing processing according to a signal output from the light receiving device, wherein the light receiving device comprises a sensor for receiving a signal light on a detection surface and outputting a signal correlating to the signal light and an optical element disposed on the front surface of the detection surface and leading the signal light to the detection surface, and the optical element has a reflecting surface slanting to the detection surface with respect to a sectional surface orthogonal to the detection surface in order to reflect the signal light from the lateral direction of the detection surface on the reflecting surface to cause the signal light to enter the detection surface, thereby the signal light from the lateral direction of the detection surface is reflected on the reflecting surface to enter the detection surface. According to the model of the present invention, it is possible to receive a signal light from a wide range to execute processing according to the signal light.

A second light receiving device for a model of the present invention is a light receiving device for a model including a sensor for receiving signal light on a detection surface and outputting a signal correlating to the signal light and an optical element disposed in confrontation with the detection surface and capable of transmitting the signal light, wherein the optical element includes a central portion and a peripheral portion adjacent to the central portion, the central portion and the peripheral portion are composed of mediums whose absolute refraction factors are different from each other, a boundary surface between the central portion and the peripheral portion being adjacent to each other is formed such that the boundary surface confronts the detection surface as well as a further inner side of the optical element more approaches the detection surface in a direction parallel with the detection surface, and the signal light direction sideward of the detection surface is reflected on the boundary surface toward the detection surface.

A second signal light detection method for a model of the present invention is a signal light detection method for a model in which an optical element capable of transmitting a signal light is disposed in confrontation with a detection surface and the signal light lead by the optical element is received on the detection surface, wherein the optical element comprises a central portion and a peripheral portion adjacent to the central portion, the central portion and the peripheral portion are composed of mediums whose absolute refraction factors are different from each other, a boundary surface between the central portion and the peripheral portion which are adjacent to each other is formed such that the boundary surface confronts the detection surface as well as a further inner side of the optical element more approaches the detection surface in a direction parallel with the detection surface, and the signal light lateral direction of the detection surface is reflected on the boundary surface toward the detection surface, and thereby the signal light is detected on the detection surface.

According to the second light receiving device for a model and the second signal light detection method for a model of the present invention, since the absolute refraction factor of the central portion is different from the absolute refraction factor of the peripheral portion, a part of the signal light from the lateral direction of the detection surface reaches the detection surface after reflected on the wall surface of the boundary surface. In contrast, the signal light from the front direction of the detection surface goes through the boundary surface and reaches the detection surface. That is, the boundary surface can maintain the intrinsic detection range of the sensor by transmitting the signal light from the front direction of the detection surface as well as expand the detection range of the sensor by reflecting the signal light from the lateral direction of the detection surface of the sensor. Accordingly, it is possible to expand the detection range without deteriorating the detection sensitivity. Note that any one of the absolute refraction factors of the central portion and the peripheral portion may be larger than the other.

In the second light receiving device for a model and the second signal light detection method for a model of the present invention, the central portion may be hollow.

In the second light receiving device for a model and the second signal light detection method for a model of the present invention, the central portion may be solid.

In the second light receiving device for a model and the second signal light detection method for a model of the present invention, the absolute refraction factor of the medium constituting the central portion may be smaller than the absolute refraction factor of the medium constituting the peripheral portion. In this case, it is possible to totally reflect the signal light from the lateral direction of the detection surface on the boundary surface to the detection surface. Accordingly, it is possible to detect the signal light from the lateral direction of the detection surface sensitively.

A second model of the present invention is a model having a light receiving device and executing processing according to a signal output from the light receiving device, wherein the light receiving device comprises a sensor for receiving signal light on a detection surface and outputting a signal correlating to the signal light and an optical element disposed in confrontation with the detection surface and capable of transmitting the signal light, the optical element comprises a central portion and a peripheral portion adjacent to the central portion, the central portion and the peripheral portion are composed of mediums whose absolute refraction factors are different from each other, a boundary surface between the central portion and the peripheral portion which are adjacent to each other is formed such that the boundary surface confronts the detection surface as well as a further inner side of the light receiving element more approaches the detection surface in a direction parallel with the detection surface, and the light receiving device reflects the signal light from the lateral direction of the detection surface to the detection surface by the boundary surface. According to the model of the present invention, it is possible to receive signal light from a wide range to execute processing according to the signal light.

The third light receiving device for a model of the present invention is a light receiving device for a model comprising a sensor for receiving incident light on a detection surface and outputting a signal correlating to the incident light, and a light receiving element disposed in confrontation with the detection surface and capable of transmitting the incident light, wherein a recessed portion is disposed to a surface opposite of a surface confronting the detection surface of the light receiving element, and the incident light from a lateral direction of the detection surface is reflected on a boundary surface of the recessed portion toward the detection surface.

According to the third light receiving device for a model of the present invention, the light entering from the lateral direction of the detection surface reaches the detection surface after reflected on the boundary surface of the recessed portion. In contrast, when the light from the front direction of the detection surface enters on the boundary surface of the recessed portion, the light goes through the wall surface to reach the detection surface. Accordingly, the wall surface can maintain the intrinsic detection range of the sensor by transmitting light from the front direction of the detection surface as well as expand the detection range of the sensor by reflecting the light from the lateral direction of the detection surface of the sensor.

In the third light receiving device for a model of the present invention, a flat surface may be formed to the boundary surface of the recessed portion. In this case, the light reflected on the flat surface is not diffused as light reflected on a curved surface. Accordingly, the amount of light of the light reflected on the flat surface is less reduced than that of the light reflected on the curved surface. In contrast, a predetermined amount of light is necessary for the sensor to detect light. Accordingly, when a flat surface is formed to confront an arbitrary direction, it is possible to increase a detection distance in the direction.

In the third light receiving device for a model of the present invention, the recessed portion may be formed so as to pass through a surface confronting the detection surface. In this case, a part of the light from the front direction of the detection surface reaches the detection surface without going through the light receiving element. Accordingly, it is possible to enhance the sensitivity of the light from the front direction of the detection surface.

In the third light receiving device for a model of the present invention, a lens formed in a shape convex to the light receiving element side may be disposed between the detection surface and the light receiving element. In this case, the light obliquely entering on the detection surface and the light entering the outside of the detection surface are converged by the lens and reach the detection surface. Accordingly, the detection range can expand.

The third light receiving device for a model of the present invention may be for the model which is remote controlled by a light beams from a transmitter as well as executes a communication with another model by a light beam, and the sensor detects the light beam from the transmitter and the light beam from the other model. When signal light is received from both a transmitter and a drive unit by one light receiving device, the positions of the transmitter and the drive unit are restricted due to the directivity of the detection surface. In this case, a remote control system having a high degree of freedom with respect to the positions of the transmitter and the drive unit can be realized by applying the light receiving device of the present invention.

The third model of the present invention is a model having a light receiving device and executing processing according to a signal output from the light receiving device, wherein the light receiving device comprises a sensor for receiving incident light on a detection surface and outputting a signal correlating to the incident light, and a light receiving element disposed in confrontation with the detection surface and capable of transmitting the signal light, a recessed portion is disposed to a surface opposite of a surface confronting the detection surface of the light receiving element, and the incident light from a lateral direction of the detection surface is reflected on the boundary surface of the recessed portion toward the detection surface. According to the model of the present invention, it is possible to receive light beams from a wide range to execute processing according to the light beams.

BEST MODE FOR CARRYING OUT THE INVENTION

Figure 1A:
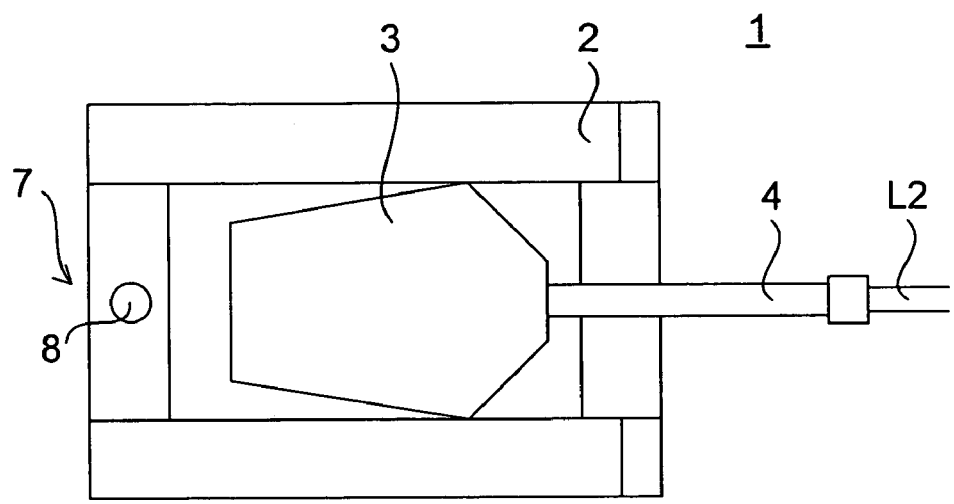
FIGS. 1A and 1B are views showing a tank model to which a light receiving device of the present invention is applied.
Figure 1B:
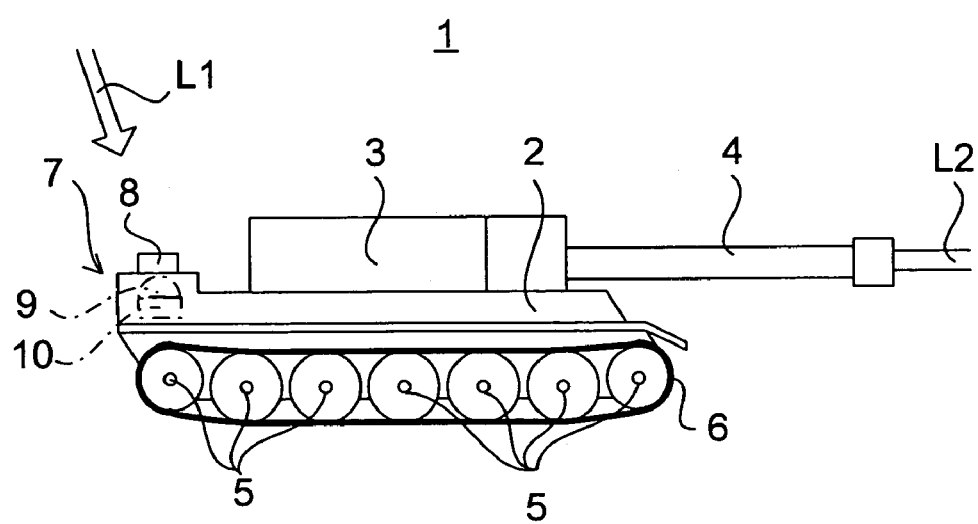

FIGS. 1A and 1B is a view showing an outside appearance of a tank model 1 to which a light receiving device of the present invention is applied. FIG. 1A is a view of the tank model 1 when observed from an upper direction, and FIG. 1B is a view of the tank model 1 when observed from a lateral direction. The tank model 1 is remote controlled in response to a remote control signal L1 transmitted from a transmitter (not shown) disposed to an upper portion thereof and arranged as drive equipment that can execute a shooting game with other tank model 1. Note that, in the embodiment, the remote control signal L1 is a light beam.

The tank model 1 includes a body 2, a gun turret 3 mounted on an upper portion of the body 2, a gun barrel 4 mounted on the gun turret 3, wheels 5 . . . 5 disposed to the body 2 so as to form trains, and caterpillars 6 each stretched to each train of the wheels 5 . . . 5 (each of right side and left side). Further, a motor as a drive source of the gun turret 3 and the wheels 5 . . . 5, a light emitting unit for outputting a light beam L2 (hereinafter, referred to as a shoot signal L2) as a shoot signal from the gun barrel 4, and a controller for controlling the operations of these units are disposed in the tank model 1 (not shown). Note that the direction in which the gun barrel 4 is mounted is defined as a front direction of the tank model 1.

The light receiving device 7 is disposed to a rear portion of the body 2. The light receiving device 7 includes a light receiving element 8, a lens 9, and a sensor 10. The light receiving element 8 is disposed to an upper portion of the body 2 so that it is almost as high as the gun barrel 4, and the lens 9 is disposed at a portion below the light receiving element 8 in the body 2. As shown also in FIG. 2C, the sensor 10 has a detection surface 10a on the upper surface thereof and can detect light beams entering thereon from a predetermined angle.

Infrared rays (light beams), for example, are used as the remote control signal L1 and the shoot signal L2. Note that when it is not necessary to particularly distinguish the remote control signal L1 and the shoot signal L2, they may be called the infrared rays or the light beams. The sensor 10 detects the remote control signal L1 from the transmitter located above through the light receiving element 8 and the lens 9 disposed on the front surface portion (an upper surface portion in FIG. 1B) of the detection surface 10a as well as detects the remote control signal L1 from the transmitter located on a side thereof and the shoot signal L2 from the other tank model 1 on a side thereof. Then, the remote control signal L1 or the shoot signal L2 is output to the controller after a carrier signal is eliminated there from. The controller controls the drive of the gun turret 3 and the wheels 5 as well as controls the shoot signal L2 output from the gun barrel 4 based on the remote control signal L1 obtained through the sensor 10. Further, when the sensor 10 detects the shoot signal L2 from the other tank model 1, it is determined that the shooting from the other tank model 1 hits the tank model 1, and processing for interrupting the drive of the tank model 1 for a predetermined time, and the like is executed. Note that a technology as to the control based on the signal from the sensor 10 is not explained in detail because it is not within the gist of the present invention.

Figure 2A:
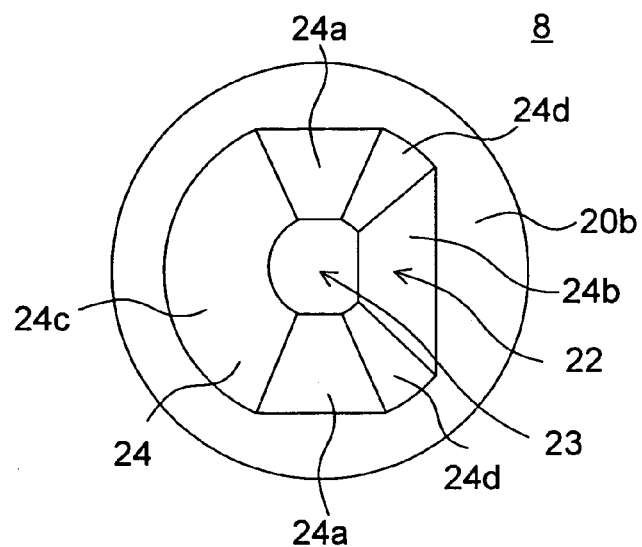
FIGS. 2A, 2B, and 2C are views showing a light receiving element provided with the tank model of FIGS. 1A and 1B.
Figure 2B:
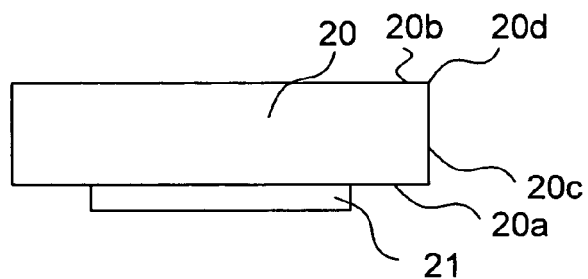
Figure 2C:
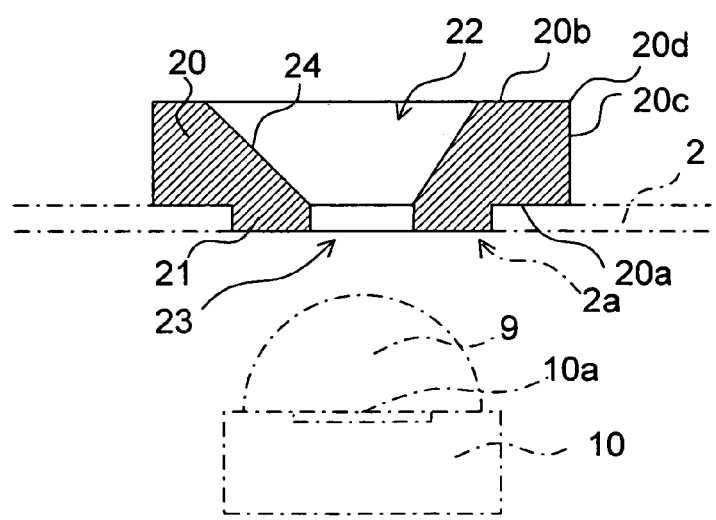

FIGS. 2A to 2C show an upper surface view, a side elevational view, and a side sectional view of the light receiving element 8 respectively. The light receiving element 8 is formed by injection molding, for example, a transparent synthetic resin. It is preferable to use a synthetic resin that transmits only the infrared rays as the light beams to be detected, a synthetic resin that transmit other light beams may be used. The light receiving element 8 includes a main body portion 20 as a columnar portion having a columned shape and a projecting portion 21 having a columned shape disposed under the main body portion 20 and having a diameter smaller than the main body portion 20. As shown in FIG. 2C, the body 2 has a hole 2a into which the projecting portion 21 is inserted, and the bottom surface 20a of the main body portion 20 is supported by the body 2.

The main body portion 20 has a recessed portion 22 in a taper shape in the upper surface 20b there of, and the projecting portion 21 has a hole portion 23 passing there through vertically. The lower end of the recessed portion 22 opens to the hole portion 23, and the light receiving element 8 has a loophole formed thereto. The wall surface 24 of the recessed portion 22 has trapezoidal flat surfaces 24a, 24a in the horizontal direction (vertical direction in FIG. 2A) of the tank model 1 and has a trapezoidal flat surface 24b wider than the flat surface 24a on the rear side of the tank model 1 (in the right direction in FIG. 2A). The front surface 24c and the obliquely rear surfaces 24d of the wall surface 24 are curved surfaces. As described below, the wall surface 24 is also a boundary surface between the light receiving element 8 and the outside air and acts as a reflecting surface of the shoot signal L2 enter the side surface 20c of the main body portion 20 of the light receiving element 8 from a lateral direction. That is, the reflecting surface slants to the detection surface 10a with respect to a cross section orthogonal to the detection surface 10a so that the signal light from a lateral direction of the detection surface 10a is lead to enter the detection surface 10a after reflected on the reflecting surface 10a.

Figure 3:
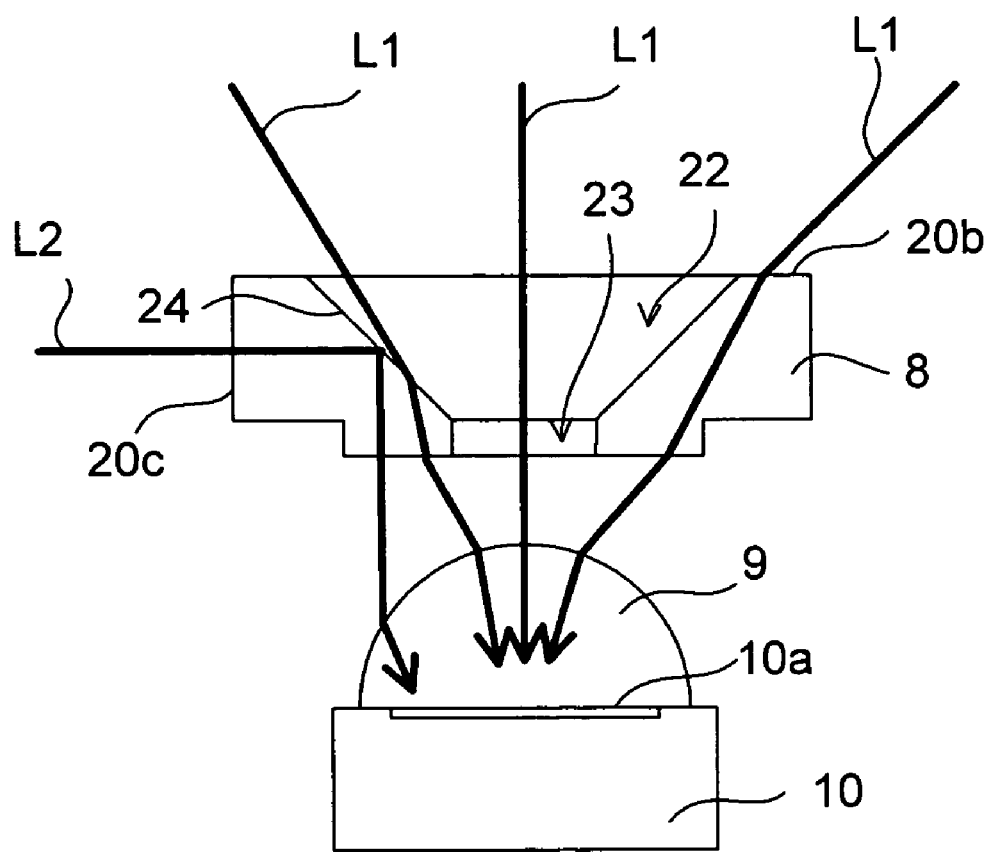
FIG. 3 is a view showing a state that light beams reach a sensor of the tank model of FIGS. 1A and 1B.

FIG. 3 shows a state that the remote control signal L1 and the shoot signal L2 enter the light receiving element 8 and reach the sensor 10. As shown in the figure, the shoot signal L2 approximately horizontally output from the gun barrel 4 enters the side surface 20c of the main body portion 20. Then, the shooting signal L2 reaches the lens 9 after reflected on the wall surface 24. In contrast, when the remote control signal L1 enters the wall surface 24, it is transmitted through the wall surface 24 and reaches the lens 9. Accordingly, the wall surface 24 maintains the intrinsic detection range of the sensor 10 by transmitting the light beams entering from the front direction of the detection surface 10a as well as expands the detection range of the sensor 10 by reflecting the light beams from the lateral direction of the detection surface 10a.

When the remote control signal L1 enters the recessed portion 22 near the center thereof, the remote control signal L1 goes through the hole portion 23 and directly reaches the lens 9. Accordingly, the remote control signal L1 can reach the lens 9 without reducing the amount of light thereof, thereby detection sensitivity (detection efficiency) can increase as compared with a case that the lower portion of the recessed portion 22 is not opened.

Figure 4:
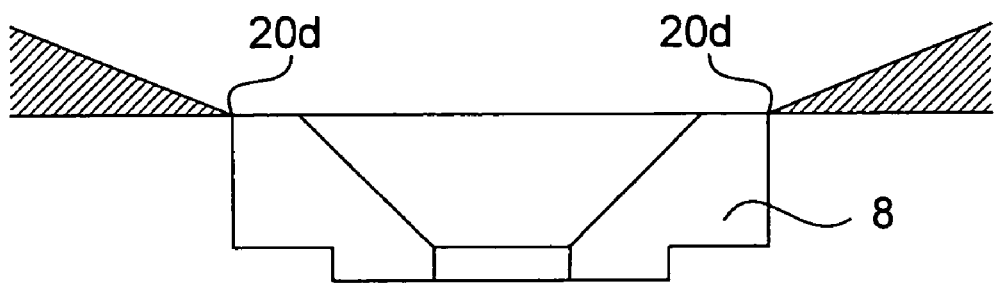
FIG. 4 is a view showing a dead band region of the light receiving device of the tank model of FIGS. 1A and 1B.

Further, when the remote control signal L1 enters the upper surface 20b, the remote control signal L1 goes through the main body portion 20 and the projecting portion 21 and reaches the lens 9. Accordingly, as shown by slant lines in FIG. 4, only the light beams entering the corner 20d of the main body portion 20 does not reach the lens 9, and the corner 20d functions as a dead band zone.

The light beams that have reached the lens 9 are refracted on the surface of the lens 9 toward the center thereof and reach the detection surface 10a. That is, the light beams, which enters obliquely to the detection surface 10a from the light receiving element 8, and the light beams, which enters the outside of the detection surface 10, can be also converged on the detection surface 10a by covering the detection surface 10a with the lens 9. Note that the lens 9 may be omitted.

Figure 5:
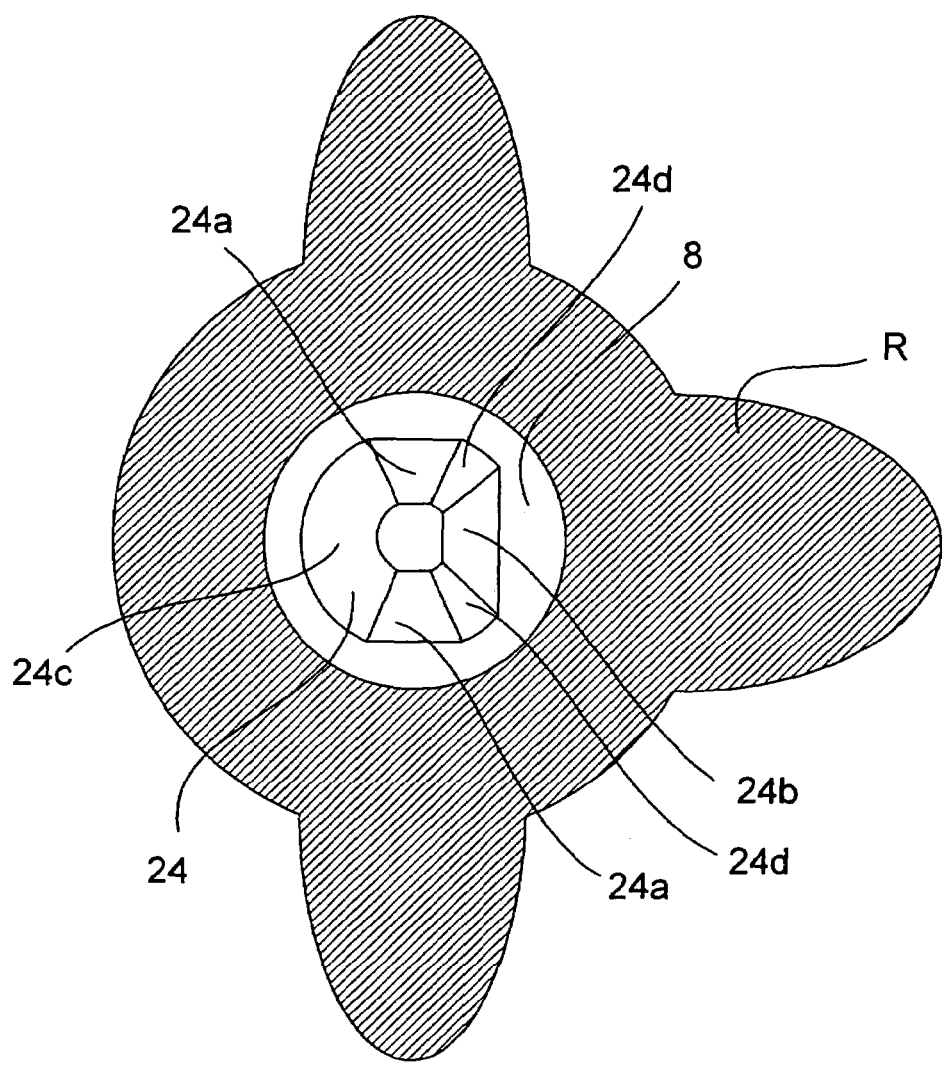
FIG. 5 is a conceptual view showing the positions of another tank model that can shoot the tank model of FIGS. 1A and 1B.

FIG. 5 is a conceptual view showing the positions of the other tank model 1 that can shoot the tank model 1. The region R shown by slant lines in the figure corresponds to the positions of the other tank model 1 that can shoot the tank model 1. The region R is determined depending on whether or not an amount of light that is necessary to detection reaches the detection surface 10a. When the shoot signal L2 enters from a front direction or an obliquely rear direction, the shoot signal L2 is diffused because it is reflected by the front surface 24c and the obliquely rear surfaces 24d that are the curved surfaces when reflected on the wall surface 24. Accordingly, the shoot signal L2 reaches the detection surface 10a with its amount of light reduced. In contrast, when the shoot signal L2 enters from a lateral direction or a rear direction, it is reflected on the side surfaces 24a, 24a or the rear surface 24b that are flat surfaces. Accordingly, the amount of light of the shoot signal L2 is less reduced than the case that it is reflected on the curved surfaces. Accordingly, the amount of light of the light beam L2, which enters the light receiving element 8 from the lateral and rear directions is less reduced than that of the light beam L2 entering from the front and obliquely rear directions. As a result, a detectable distance in the lateral and rear directions is longer than that in the front and obliquely rear directions. As described above, in the light receiving device 7 of the present invention, it is possible to adjust an amount of light when light beams entering the light receiving device 7 reach the detection surface by the shape of the wall surface 24 to expand or decrease a light beam detection distance from an arbitrary direction. For example, it is possible to make a design according to an actual situation in which a detection distance in the lateral and rear directions is expanded in consideration that tanks are poor at attack from the lateral and rear directions, and the like.

As described above, according to the present invention, the wall surface 24 provided with the light receiving element 8 permits the single light receiving device 7 to detect the remote control signal L1 from the transmitter disposed to the upper portion of the tank model 1 as well as to detect the shoot signal L2 from the other tank model 1.

FIGS. 6A to 12C are views showing other examples of the application of the light receiving device of the present invention. Note that FIGS. something A are views of the light receiving device when observed from an upper direction, FIGS. something B are views of the light receiving device when observed from a lateral direction, and FIGS. something C are views of the light receiving device when observed from the lateral direction as well as sectional views of the light receiving element.

Figure 6A:
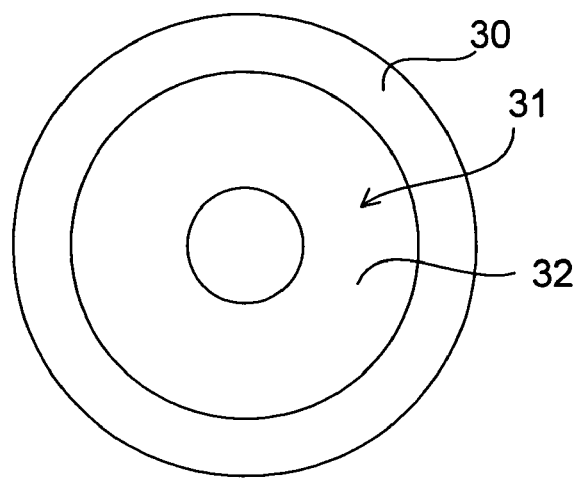
FIGS. 6A, 6B, and 6C show modified examples of the light receiving device of the present invention.
Figure 6B:
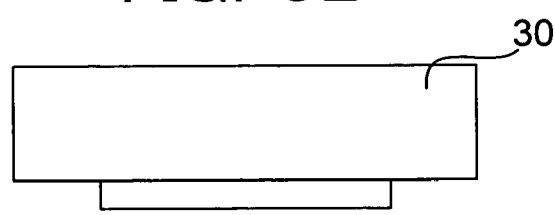
Figure 6C:
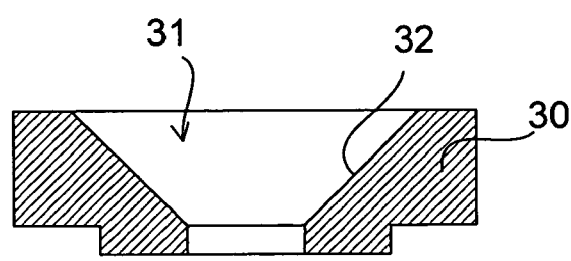
Figure 6C:
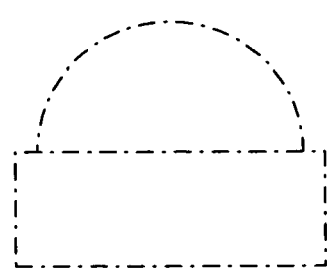

FIGS. 6A to 6C show an example that no flat surface is disposed to a recessed portion 31 of a light receiving element 30 and a wall surface 32 is composed of a uniform curved surface. This example is suitable to a case that a uniform detectable range is set omnidirectionally.

Figure 7A:
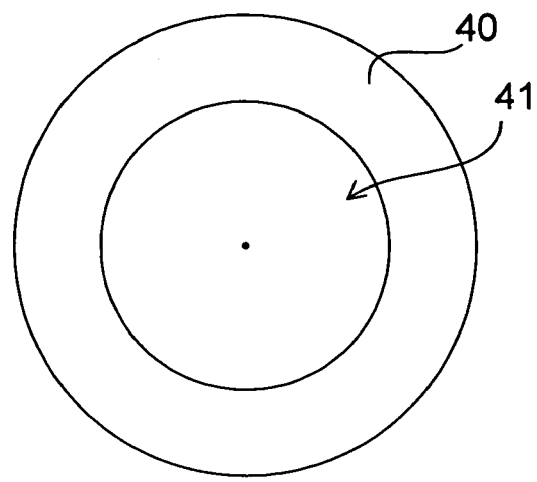
FIGS. 7A, 7B, and 7C show modified examples of the light receiving device of the present invention.
Figure 7B:
Figure 7C:
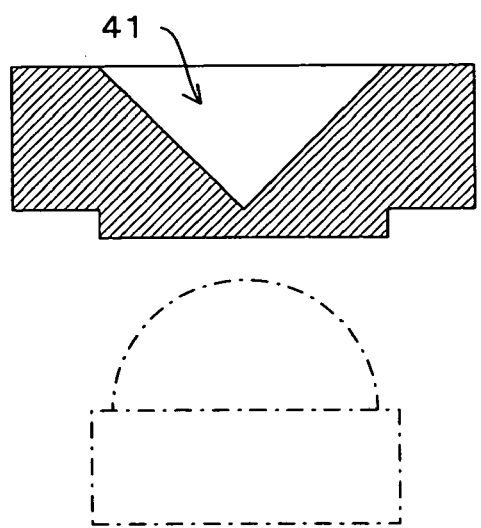

FIGS. 7A to 7C show an example that the lower portion of a recessed portion 41 of a light receiving element 40 is not opened. In this case, there is no possibility that nothing other than light beams is transmitted through the recessed portion 41, this example is suitable when dustproof, waterproof, and the like are required.

Figure 8A:
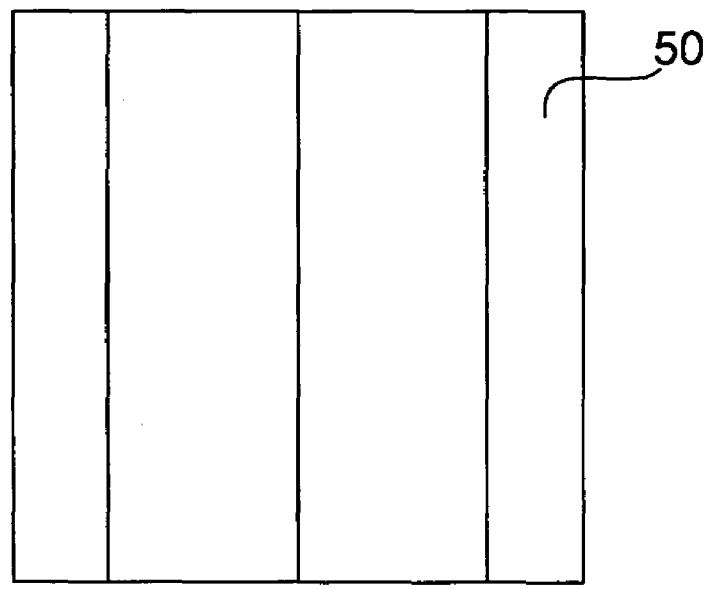
FIGS. 8A and 8B show modified examples of the light receiving device of the present invention.
Figure 8B:
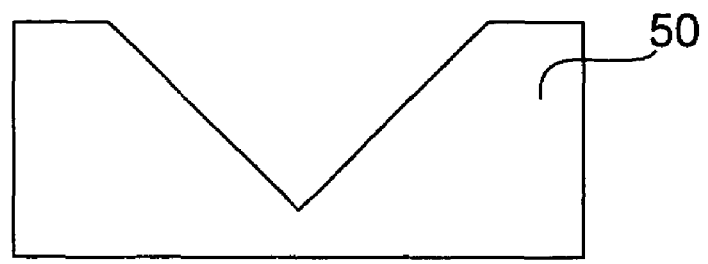
Figure 8B:
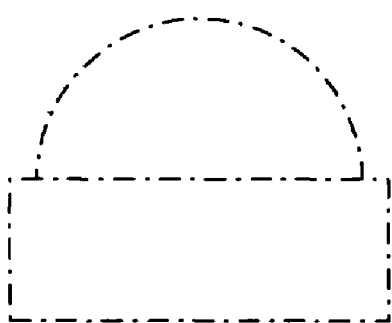

FIGS. 8A and 8B show an example that a light receiving element 50 is formed in a V-shape. This example is suitable when the light beams from a lateral direction of a detection surface of a sensor must be detected only with respect to a horizontal direction in the figures.

Figure 9A:
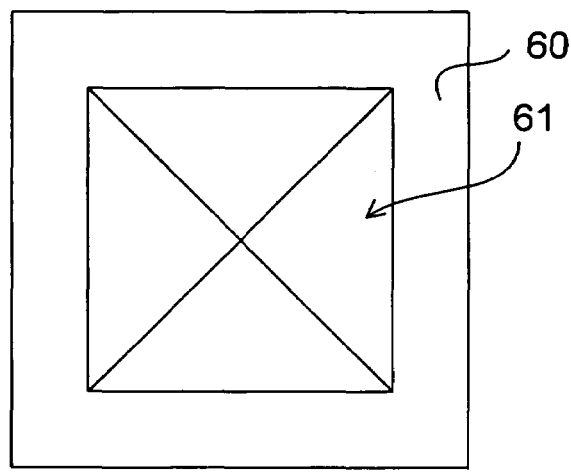
FIGS. 9A, 9B, and 9C show modified examples of the light receiving device of the present invention.
Figure 9B:
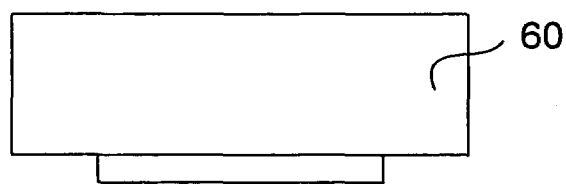
Figure 9C:
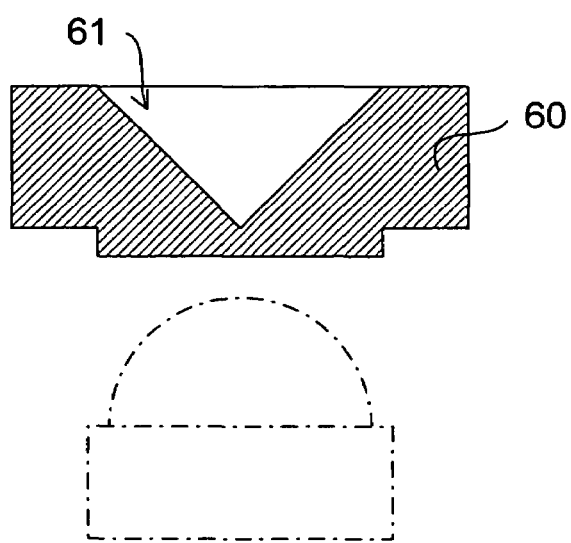

FIGS. 9A to 9C show an example that a recessed portion 61 of a light receiving element 60 in a rectangular parallele piped shape is formed in a quadrangular pyramid shape. This example is suitable for a case in which it is particularly important to detect the light beams from a lateral direction of the detection surface of a sensor with respect to four directions, i.e. right, left, up, and down directions in the figures.

Figure 10A:
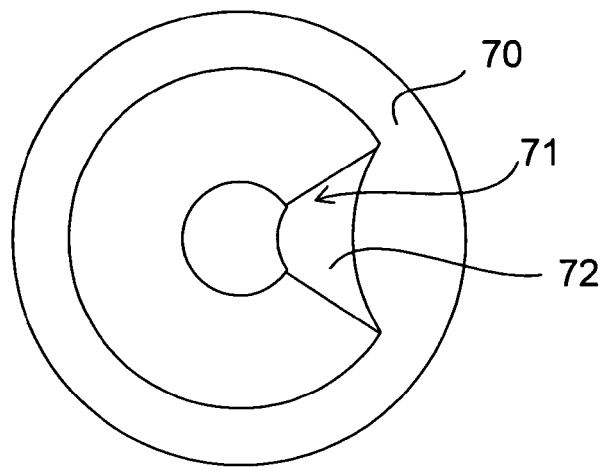
FIGS. 10A, 10B, and 10C show modified examples of the light receiving device of the present invention.
Figure 10B:
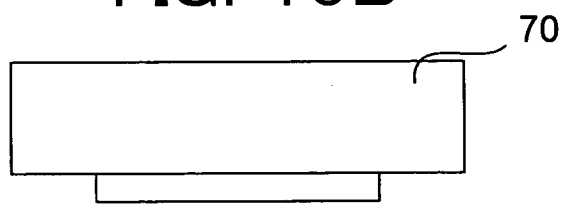
Figure 10C:
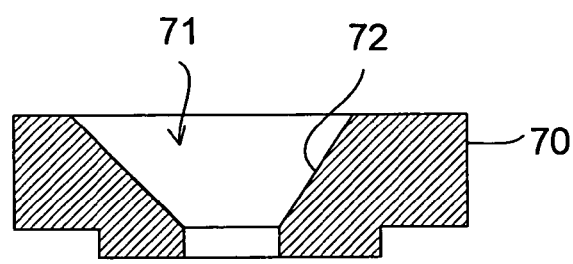
Figure 10C:
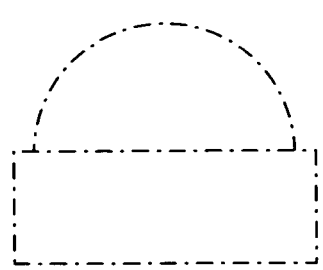
Figure 11A:
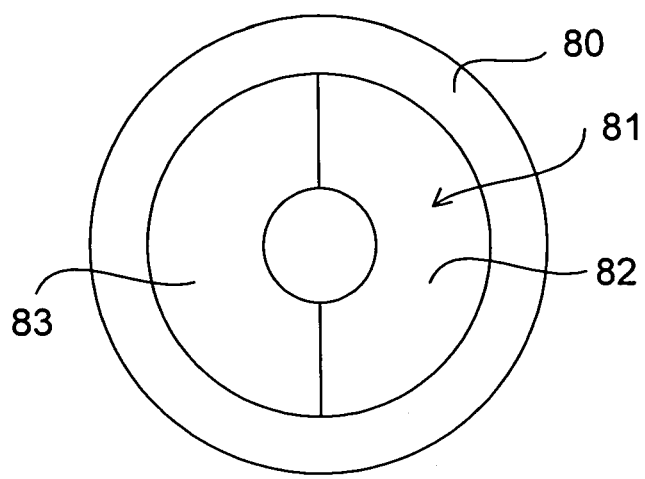
FIGS. 11A, 11B, and 11C show modified examples of the light receiving device of the present invention.
Figure 11B:
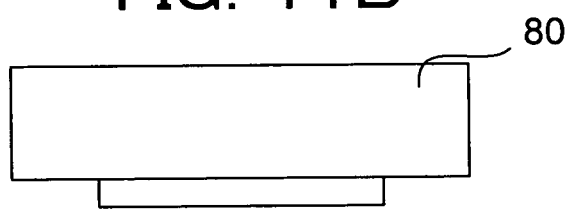
Figure 11C:
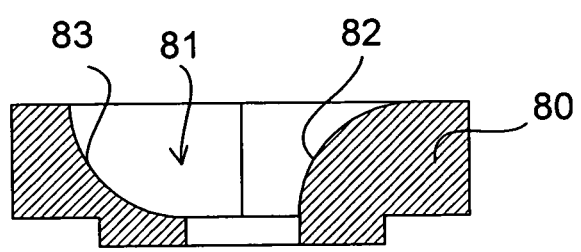
Figure 11C:
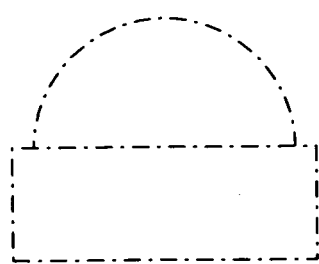

When a curved surface is formed on the wall surface of a recessed portion, a concave curved surface may be formed in a recessed portion when the light receiving element is observed from an upper direction as shown in FIG. 5, and the like. Alternatively, a convex curved surface 72 may be formed in a recessed portion 71 when a light receiving element 70 is observed from the upper direction as shown in FIGS. 10A to 10C. Further, as shown in FIGS. 11A to 11C, a convex curved surface 82 may be formed in a recessed portion 81 when a light receiving element 80 is observed from a lateral direction. Also, a concave curved surface 83 may be formed in the recessed portion 81 when the light receiving element 80 is observed from a lateral direction. The curved surfaces 72, 82 can reflect the light beams entering thereon so that they are converged to a detection surface. Accordingly, it is possible to expand the detection range of the light beams from the lateral direction of the detection surface by providing a light receiving element larger than the detection surface.

Figure 12A:
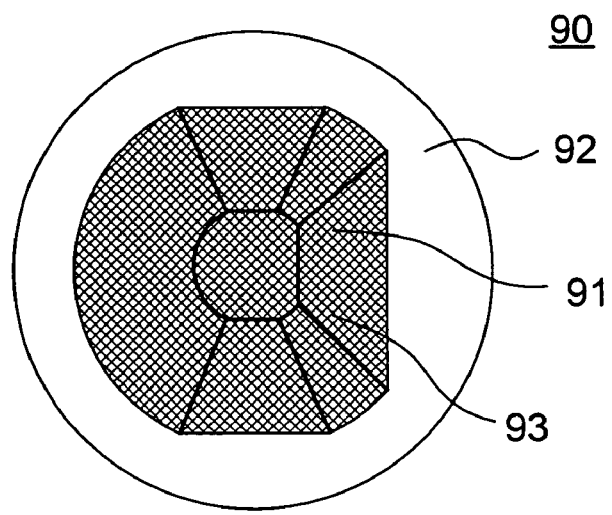
FIGS. 12A, 12B, and 12C show modified examples of the light receiving device of the present invention.
Figure 12B:
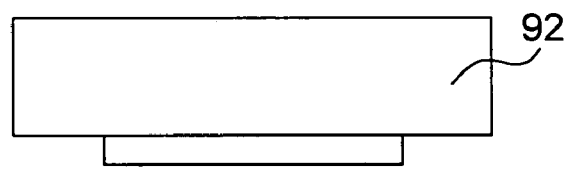
Figure 12C:
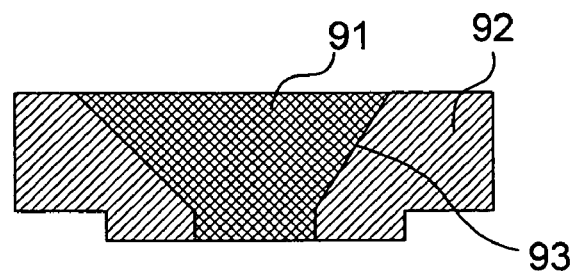
Figure 12C:
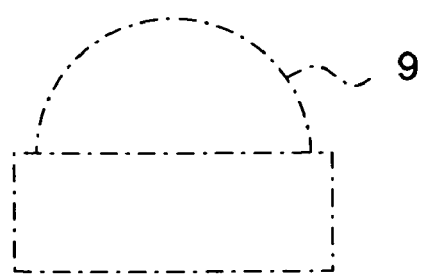

FIGS. 12A to 12C show an example that a light receiving element 90 includes a central portion 91 and a peripheral portion 92. The central portion 91 and the peripheral portion 92 are composed of mediums whose absolute refraction factors are different from each other. Further, the absolute refraction factor of the central portion 91 is smaller than that of the peripheral portion 92. Accordingly, when the shoot signal L2 enters from a lateral direction of the peripheral portion 92 likewise the light receiving element 8, the shoot signal L2 enters the lens 9 after being reflected on a boundary surface 93. In contrast, when the remote control signal L1 enters from an upper direction of the central portion 91 or the peripheral portion 92, the remote control signal L1 goes through the central portion 91 or the peripheral portion 92 and enters the lens 9. Note that the shape of the peripheral portion 92 is the same as that of the main body portion 20 and the projecting portion 21. Accordingly, when the central portion 91 is made hollow, the light receiving element 90 functions as the light receiving element 8, and the boundary surface 93 functions as the wall surface 24.

INDUSTRIAL APPLICABILITY

According to the light receiving device and the light receiving method of the present invention, the light beams entering from the lateral direction of the detection surface reach the detection surface after they are reflected on the wall surface of the recess portion. In contrast, when light beams enters the wall surface of the recessed portion from the front direction of the detection surface, the light beams got through the wall surface and reach the detection surface. Accordingly, the wall surface can maintain the intrinsic detection range of the sensor by allowing the light beams from the front direction of the detection surface to go through as well as can expand the detection range of the sensor by reflecting the light beams from the lateral direction of the detection surface of the sensor.

The invention claimed is:

1. A light receiving device for a model for receiving signal light and outputting an electric signal according to the signal light, comprising:
   a sensor for receiving the signal light on a detection surface and outputting a signal correlating to the signal light; and
   an optical element disposed on a front surface of the detection surface for leading the signal light to the detection surface,
   wherein the optical element has a reflecting surface slanting to the detection surface with respect to a sectional surface orthogonal to the detection surface in order to cause the signal light from a lateral direction of the detection surface to be incident on the detection surface after reflected on the reflecting surface,
   wherein
   the optical element has a columnar portion,
   one end surface of the columnar portion confronts the detection surface,
   the reflecting surface is composed of a boundary surface formed by disposing a recessed portion to an other end surface of the columnar portion,
   the optical element reflects the signal light entering the columnar portion from a side surface thereof on the boundary surface, and emits the signal light from the one end surface to cause the signal light to enter the detection surface, and
   the boundary surface has at least one flat surface and at least one curved surface arranged next to each other in a circumferential direction on the boundary surface.

2. The light receiving device for a model according to claim 1, wherein the recessed portion passes through the detection surface.

3. The light receiving device for a model according to claim 1, wherein a flat surface is formed to the boundary surface.

4. The light receiving device for a model according to claim 1, wherein a curved surface is formed to the boundary surface.

5. The light receiving device for a model according to claim 1, wherein a lens formed in a shape convex to the optical element side is disposed between the detection surface and the optical element.

6. The light receiving device for a model according to claim 1, wherein the light receiving device for a model is mounted in the model which is remote controlled by a signal light from a transmitter as well as executes a communication with another model by a signal light, and the sensor detects the signal light from the transmitter and the signal light from the other model.

7. A model having a light receiving device and a controller for controlloing the model according to a signal output from the light receiving device, wherein the light receiving device comprises a sensor for receiving signal light on a detection surface and outputting a signal correlating to the signal light; and
   an optical element disposed on a front surface of the detection surface and leading the signal light to the detection surface,
   wherein the optical element has a reflecting surface slanting to the detection surface with respect to a sectional surface orthogonal to the detection surface in order to reflect the signal light from a lateral direction of the detection surface to cause the signal light to enter the detection surface,
   wherein
   the optical element has a columnar portion,
   one end surface of the columnar portion confronts the detection surface,
   the reflecting surface is composed of a boundary surface formed by disposing a recessed portion to an other end surface of the columnar portion,
   the optical element reflects the signal light entering the columnar portion from a side surface thereof on the boundary surface, and emits the signal light from the one end surface to cause the signal light to enter the detection surface, and
   the boundary surface has at least one flat surface and at least one curved surface arranged next to each other in a circumferential direction on the boundary surface.

8. A light receiving device for a model comprising:
   a sensor for receiving signal light on a detection surface and outputting a signal correlating with the signal light; and
   an optical element disposed in confrontation to the detection surface and capable of transmitting the signal light,
   wherein
   the optical element comprises a central portion and a peripheral portion surrounding the central portion;
   the central portion and the peripheral portion are composed of mediums whose absolute refraction factors are different from each other;
   a boundary surface between the central portion and the peripheral portion being adjacent to each other is formed such that the boundary surface confronts the detection surface as well as a further inner side of the optical element more approaches the detection surface in a direction parallel with the detection surface; and
   the signal light from a lateral direction of the detection surface is reflected on the boundary surface toward the detection surface, wherein
   the boundary surface has at least one flat surface and at least one curved surface arranged next to each other in a circumferential direction thereof.

9. The light receiving device for a model according to claim 8, wherein the central portion is solid.

10. The light receiving device for a model according to claim 8, wherein the absolute refraction factor of the medium constituting the central portion is smaller than the absolute refraction factor of the medium constituting the peripheral portion.

11. A model having a light receiving device and a controller for controlling the model according to a signal output from the light receiving device, wherein
    the light receiving device comprises a sensor for detecting signal light on a detection surface and outputting a signal correlating with the signal light and an optical element disposed in confrontation with the detection surface and capable of transmitting the signal light;

the optical element comprises a central portion and a peripheral portion surrounding the central portion;

the central portion and the peripheral portion are composed of mediums whose absolute refraction factors are different from each other;

a boundary surface between the central portion and the peripheral portion which are adjacent to each other is formed such that the boundary surface confronts the detection surface as well as an further inner side of the optical element more approaches the detection surface in a direction parallel with the detection surface; and the signal light from a lateral direction of the detection surface is reflected on the boundary surface toward the detection surface, wherein the boundary surface has at least one flat surface and at least one curved surface arranged next to each other in a circumferential direction thereof.

12. A signal light detection method for a model comprising the steps of:

disposing an optical element for leading signal light to a detection surface on a front surface portion of the detection surface; and disposing a reflecting surface whose diameter is gradually reduced toward the detection surface in the optical element, wherein the signal light from a lateral direction of the detection surface is detected by reflecting the signal light on the reflecting surface to cause the signal light to enter the detection surface, wherein a columnar portion is disposed to the optical element, one end surface of the columnar portion confronts the detection surface, the reflecting surface is composed of a boundary surface formed by disposing a recessed portion to an other end surface of the columnar portion, the signal light entering from a columnar surface of the columnar portion is reflected on the reflecting surface to cause the signal light to enter the detection surface, and the boundary surface has at least one flat surface and at least one curved surface arranged next to each other in a circumferential direction on the boundary surface.

13. The signal light detection method for a model according to claim 12, wherein the recessed portion passes through the detection surface.

14. The signal light detection method for a model according to claim 12, wherein a lens formed in a shape convex to an optical element side is disposed between the detection surface and the optical element.

15. The signal light detection method for a model according to claim 12 is a signal light detection method for a model being remote controlled by a signal light from a transmitter as well as executing a communication with another model by a signal light, wherein the signal light from the transmitter and the signal light from the other model are detected on the detection surface.

16. A signal light detection method for a model comprising:

detecting a signal light on a detection surface disposed in confrontation with an optical element adapted to transmit the signal light, wherein:

the optical element comprises a central portion and a peripheral portion surrounding the central portion;

the central portion and the peripheral portion are composed of mediums whose absolute refraction factors are different from each other;

a boundary surface between the central portion and the peripheral portion which are adjacent to each other is formed such that the boundary surface confronts the detection surface as well as a further inner side of the optical element more approaches the detection surface in a direction parallel with the detection surface; and the signal light from a lateral direction of the detection surface is detected on the detection surface by reflecting the signal light on the boundary surface toward the detection surface, wherein the boundary surface has at least one flat surface and at least one curved surface arranged next to each other in a circumferential direction thereof.

17. The signal light detection method for a model according to claim 16, wherein the central portion is solid.

18. The signal light detection method for a model according to claim 16, wherein the absolute refraction factor of the medium constituting the central portion is smaller than the absolute refraction factor of the medium constituting the peripheral portion.

19. A light receiving device comprising:

a sensor for outputting a signal correlating to incident light received on a detection surface; and a light receiving element being disposed in confrontation with the detection surface and capable of transmitting the incident light, wherein a recessed portion is disposed on a surface opposite of a surface confronting the detection surface of the light receiving element, the recessed portion comprising a central portion and a boundary surface surrounding the central portion, and the incident light from a lateral direction of the detection surface is reflected on the boundary surface of the recessed portion toward the detection surface, and wherein the boundary surface has at least one flat surface and at least one curved surface arranged next to each other in a circumferential direction thereof.

20. The light receiving device for a model according to claim 19, wherein the recessed portion is formed so as to pass through the surface confronting the detection surface.

21. The light receiving device for a model according to claim 19, wherein a lens formed in a shape convex to the optical element side is disposed between the detection surface and the optical element.

22. The light receiving device for a model according to claim 19, wherein the light receiving device for a model is mounted in the model which is remote controlled by a light beam from a transmitter as well as executes a communication with another model by a light beam, and the sensor detects the light beam from the transmitter and the light beam from the other model.

23. A model comprising:

a light receiving device and a controller for controlling the model according to a signal output from the light receiving device, wherein the light receiving device comprises:

a sensor for outputting a signal correlating to an incident light received on a detection surface;

a light receiving element being disposed in confrontation with the detection surface and capable of transmitting the incident light; and a recessed portion is disposed to an opposite surface of a surface confronting the detection surface of the light receiving element, the recessed portion comprising a central portion and a boundary surface surrounding the central portion, wherein the incident light from a lateral direction of the detection surface is reflected on the boundary surface of the recessed portion toward the detection surface, and wherein the boundary surface has at least one flat surface and at least one curved surface arranged next to each other in a circumferential direction thereof.

* * * * *